: US010054619B2

United States Patent
Clemente et al.

(10) Patent No.: US 10,054,619 B2
(45) Date of Patent: Aug. 21, 2018

(54) SYSTEMS AND METHODS FOR VOLTAGE SENSING

(71) Applicant: General Electric Company, Schenectady, NY (US)

(72) Inventors: Miguel Garcia Clemente, München (DE); Philipp Leuner, München (DE); Thomas Alois Zoels, Hebertshausen (DE); Bertrand Bastien, München (DE); Alvaro Jorge Mari Curbelo, Oberschleissheim (DE)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 15/397,588

(22) Filed: Jan. 3, 2017

(65) Prior Publication Data
US 2018/0188299 A1    Jul. 5, 2018

(51) Int. Cl.
*G01R 19/32* (2006.01)
*G01R 15/14* (2006.01)
*G01R 19/00* (2006.01)

(52) U.S. Cl.
CPC ............ *G01R 19/32* (2013.01); *G01R 15/14* (2013.01); *G01R 19/0084* (2013.01)

(58) Field of Classification Search
CPC ..... G01R 19/32; G01R 19/0084; G01R 15/14
See application file for complete search history.

(56) References Cited

U.S. PATENT DOCUMENTS

| 7,988,354 B2 | 8/2011 | Jansen | |
| 2003/0085758 A1* | 5/2003 | Perner | H03F 3/45744 330/9 |
| 2003/0184348 A1* | 10/2003 | Lee | H03K 5/2472 327/100 |
| 2005/0099751 A1 | 5/2005 | Kumagai | |
| 2010/0007358 A1* | 1/2010 | Schaerrer | G01R 15/14 324/649 |
| 2010/0157627 A1* | 6/2010 | Wang | G01R 19/0084 363/15 |
| 2010/0329157 A1* | 12/2010 | Xing | H03F 1/3211 370/278 |

(Continued)

FOREIGN PATENT DOCUMENTS

EP        2933646 A1    10/2015

OTHER PUBLICATIONS

Beczkowski et al., "Online Vce measurement method for wear-out monitoring of high power IGBT modules", Power Electronics and Applications (EPE), 2013 15th European Conference on, pp. 1-7, Sep. 2-6, 2013, Lille.

(Continued)

*Primary Examiner* — Jermele M Hollington
*Assistant Examiner* — Alvaro Fortich
(74) *Attorney, Agent, or Firm* — GE Global Patent Operation; Pabitra K. Chakrabarti (57) ABSTRACT

Systems and methods are provided to measure a voltage across a two-state dipole. The systems and methods measure voltages across two measurement paths of operational circuitry at first and second sensor terminals. The operational circuitry is configured to decouple the first and second sensor terminal based on a dipole voltage. The systems and methods further estimate the dipole voltage based on the voltages of the two measurement paths.

20 Claims, 5 Drawing Sheets

(56) References Cited

U.S. PATENT DOCUMENTS

| | | | |
|---|---|---|---|
| 2012/0182071 A1* | 7/2012 | Takei | H03F 3/45192 |
| | | | 330/253 |
| 2013/0120030 A1 | 5/2013 | Kora | |
| 2014/0125366 A1 | 5/2014 | Thögersen et al. | |
| 2014/0212289 A1 | 7/2014 | Thogersen et al. | |
| 2015/0063417 A1 | 3/2015 | Jeong et al. | |

OTHER PUBLICATIONS

Liang-Deng et al., "On-line measuring method of high-power IGBT collector current", Electrical Machines and Systems (ICEMS), 2014 17th International Conference on, pp. 1945-1951, Oct. 22-25, 2014, Hangzhou.

Trintis et al., "On-state voltage drop based power limit detection of IGBT inverters", Power Electronics and Applications (EPE—15 ECCE-Europe), 2015 17th European Conference on, pp. 1-9, Sep. 8-10, 2015, Geneva.

\* cited by examiner

SYSTEMS AND METHODS FOR VOLTAGE SENSING

FIELD

Embodiments of the subject matter described herein relate to voltage sensing across a two-state dipole.

BACKGROUND

Two-state dipoles are utilized as electronic switches for power terminals of high voltage semiconductors, such as isolated gate bipolar transistors (IGBT), a power metal oxide semiconductor field-effect transistor, diodes, thyristors (e.g., gate turn-off thyristor), and/or the like. The two-state dipole switches between two states, an ON state (e.g., saturation state) and an OFF state. During the saturation state, a voltage drop across the dipole is comparatively low, such as a few volts, and relatively constant relative to the OFF state when the voltage drop across the dipole is high, such as a few kilovolts. To determine a state of the two-state dipole, conventional methods provide circuitry that is positioned proximate to the two-state dipole to measure a voltage of the two-state dipole. Specifically, the conventional methods are utilized to determine when the two-state dipole is in the ON state. For example for an IGBT, conventional methods only determine when a Vce of the IGBT is stationary representing an ON state (e.g., the first state). Additionally, conventional methods include isolation components to withstand the high voltage of the second state of the dipole. However, the isolation components reduce the accuracy of the conventional method to measure the Vce in the ON state. Additionally, conventional methods are affected by temperature based on temperature coefficients of the components utilized by the conventional methods. For example, a temperature of the isolation components of the conventional method may range from −40° C. to 100° C. due to the proximity to the heat dissipating power terminals of the dipole. Due to the temperature changes the voltage measured by the conventional methods is offset based on the temperature coefficients affecting the measured voltage representing the two-state dipole voltage.

BRIEF DESCRIPTION

In an embodiment, a system (e.g., a voltage measurement system) is provided for a two-state dipole. The system includes a reference terminal electrically coupled to a first dipole terminal of a dipole and a measurement terminal electrically coupled to a second dipole terminal of a dipole. The system also includes an isolation circuit electrically coupled to the measurement terminal, and a compensation circuit electrically coupled to the isolation circuit. The isolation circuit is configured to decouple the measurement terminal from the compensation circuit based on a dipole voltage at the measurement terminal. The system includes a measurement circuit having three terminals. A first terminal is electrically coupled to the reference terminal, a second terminal is electrically coupled to the compensation circuit, and a third terminal is electrically coupled to a node interposed between the compensation circuit and the isolation circuit. The measurement circuit configured to measure a first voltage at the second terminal and a second voltage at the third terminal. The measurement circuit is configured to estimate the dipole voltage based on the first and second voltages.

In an embodiment, a method is provided. The method includes measuring voltages across two measurement paths of operational circuitry at first and second sensor terminals. The operational circuitry is configured to decouple the first and second sensor terminal based on a dipole voltage. The method includes estimating the dipole voltage based on the voltages of the two measurement paths.

In an embodiment, a system (e.g., a voltage measurement system for a two-state dipole) is provided. The system includes reference and measurement terminals electrically coupled to opposing terminals of a dipole. The system also includes an isolation circuit electrically coupled to the measurement terminal. The isolation circuit having one or more diodes. The cathodes of the one or more diodes are electrically coupled to the measurement terminal. The system includes a compensation circuit electrically coupled to the isolation circuit. The compensation circuit having at least one diode. A cathode of the at least one diode is electrically coupled to the isolation circuit. The isolation circuit being configured to decouple the measurement terminal from the compensation circuit based on a dipole voltage at the measurement terminal. The system includes a power supply electrically coupled to the compensation circuit. The system includes a measurement circuit having three terminals. A first terminal is electrically coupled to the reference terminal, a second terminal is electrically coupled to the power supply, and a third terminal is electrically coupled to a node interposed between the compensation circuit and the isolation circuit. The measurement circuit configured to measure a first voltage at the second terminal and a second voltage at the third terminal. The measurement circuit is configured to estimate the dipole voltage based on the first and second voltages and a number of the one or more diodes of the isolation circuit and the at least one diode of the compensation circuit.

DETAILED DESCRIPTION

Various embodiments will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks (e.g., processors, controllers or memories) may be implemented in a single piece of hardware (e.g., a general purpose signal processor or random access memory, hard disk, or the like) or multiple pieces of hardware. Similarly, any programs may be stand-alone programs, may be incorporated as subroutines in an operating system, may be functions in an installed software package, and the like. It should be understood that the various embodiments are not limited to the arrangements and instrumentality shown in the drawings.

As used herein, the terms "system," "unit," or "module" may include a hardware and/or software system that operates to perform one or more functions. For example, a module, unit, or system may include a computer processor, controller, or other logic-based device that performs operations based on instructions stored on a tangible and non-transitory computer readable storage medium, such as a computer memory. Alternatively, a module, unit, or system may include a hard-wired device that performs operations based on hard-wired logic of the device. The modules or units shown in the attached figures may represent the hardware that operates based on software or hardwired instructions, the software that directs hardware to perform the operations, or a combination thereof. The hardware may include electronic circuits that include and/or are connected to one or more logic-based devices, such as microprocessors, processors, controllers, or the like. These devices may be off-the-shelf devices that are appropriately programmed or instructed to perform operations described herein from the instructions described above. Additionally or alternatively, one or more of these devices may be hard-wired with logic circuits to perform these operations.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Generally, various embodiments provide methods and systems for voltage sensing a two-state dipole. The two-state dipole may be conductively coupled to a power system. A voltage measurement system, in accordance with various embodiments, may be configured to measure a voltage of the two-state dipole when in an ON state (e.g., saturation state). The voltage measurement system may include a first and second sensor terminals, which are utilized by a measurement circuit to determine a dipole voltage during the ON state of the two-state dipole. The voltage measurement system includes a compensation circuit. The compensation circuit may include one or more diodes. For example, the compensation circuit may have a first and second diode configured in anti-parallel with respect to each other. The measurement circuit may be configured to calculate the voltage of the two-state dipole based on the first and second sensor terminals by compensating for the effects of the temperature coefficients of a first diode and power supply electrically coupled to the measurement circuit. Additionally or alternatively, the compensation circuit may include a semiconductor switch. The compensation circuit is configured to clamp one of the sensor terminals during one of the states (e.g., OFF state) of the two-state dipole to protect the measurement circuit.

The voltage measurement system includes an isolation circuit configured to isolate the measurement circuit from the dipole voltage. For example, the isolation circuit may include one or more diodes configured to be at a reverse polarity with respect to the measurement terminal such that a reverse voltage of the plurality of dipoles is configured to insulate the measurement circuit during the OFF state of the two-state dipole.

Additionally or alternatively, the compensation circuit may include a first resistor and the isolation circuit is electrically coupled to a second resistor. The first resistor may be configured to compensate for the voltage drop across the second resistor. Optionally, the first and second resistors are based on the number of diodes in the isolation circuit. For example, a ratio of impedance between the first and second resistors may be based on a ratio of the number of diodes of the isolation circuit.

At least one technical effect of various embodiments provides an accurate overcurrent detection for protecting the power electrical system including the two-state dipole during a state (e.g., ON state) of the two-state dipole. At least one technical effect of various embodiments provides health monitoring of the two-state dipole based on variations of the saturation voltage that may indicate device degradation (e.g., bonding wire failure). At least one technical effect of various embodiments provides increased resolution and/or reliability of the voltage sensing of the two-state dipole. At least one technical effect of various embodiments reduces cost for a voltage measurement system.

Figure 1:
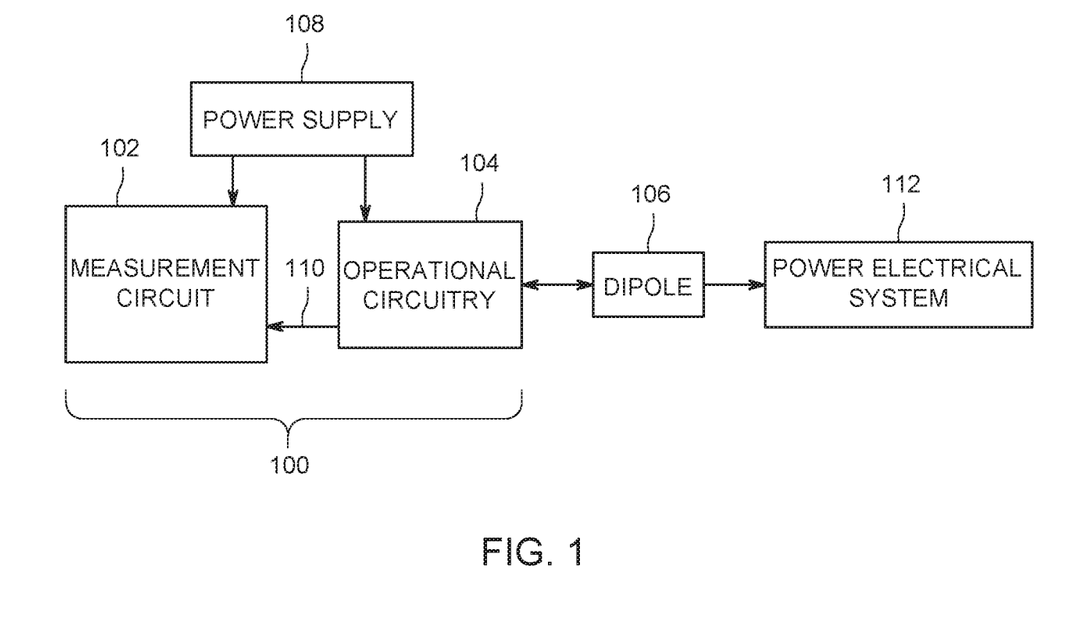
FIG. 1 illustrates a schematic block diagram of an embodiment of a voltage measurement system.

FIG. 1 illustrates a schematic block diagram of an embodiment of a voltage measurement system 100. The voltage measurement system 100 includes a measurement circuit 102, and operational circuitry 104 electrically and/or conductively coupled to each other via a terminal bus 110. Optionally, the voltage measurement system 100 may include a power supply 108. The voltage measurement system 100 is electrically coupled to a two-state dipole 106. The voltage measurement system is configured to measure a dipole voltage of the two-state dipole 106 during a saturation state and isolate the measurement circuit 102 from the high voltages of the two-state dipole 106 during the OFF state. The two-state dipole 106 may be an isolated gate bipolar transistor (IGBT), a power metal oxide semiconductor field-effect transistor, a thyristor, a field coil of a field excited synchronous machine, and/or the like. The two-state dipole 106 may be configured to control a power electrical system 112. The power electrical system 112 may represent an electric power system for a variable frequency drive, a drive train, a home appliance, and/or the like. The two-state dipole 106 may be configured to switch between an ON state (e.g., saturation state) and an OFF state at a static and/or variable frequency (e.g., 60 hertz, 70 hertz, 2 kilohertz, 16 kilohertz, and/or the like). For example, during the saturation state the Vce of the two-state dipole 106 may be below five volts. During the OFF state the Vce of the two-state dipole 106 may be over one kilovolt.

The measurement circuit 102 controls the operation of the voltage measurement system 100. The measurement circuit 102 may be embodied in hardware, such as one or more processors, controller, or other logic-based device, that performs functions or operations based on one or more sets of instructions (e.g., software). Additionally or alternatively, the measurement circuit 102 may be an application specific integrated circuit, a field programmable gate array, and/or the like configured for the voltage measurement system 100. The instructions on which the hardware operates may be stored on a tangible and non-transitory (e.g., not a transient signal) computer readable storage medium, such as memory (e.g., a memory 208 shown in FIG. 2). The memory may include one or more computer hard drives, flash drives, RAM, ROM, EEPROM and/or the like. Alternatively, one or more of the sets of instructions that direct operations of the hardware may be hard-wired into the logic of the hardware.

Additionally or alternatively, the voltage measurement system 100 may include the power supply 108. The power supply 108 may be configured to supply electric energy (e.g., current and/or voltage) to the measurement circuit 102 and/or the operational circuitry 104. Additionally or alternatively, the power supply 108 may be conductively coupled to a power rail of the power electrical system 112. For example, the power supply 108 may be a power regulator electrically coupled to the power rail configured to supply electric energy to the measurement system 100.

Figure 2:
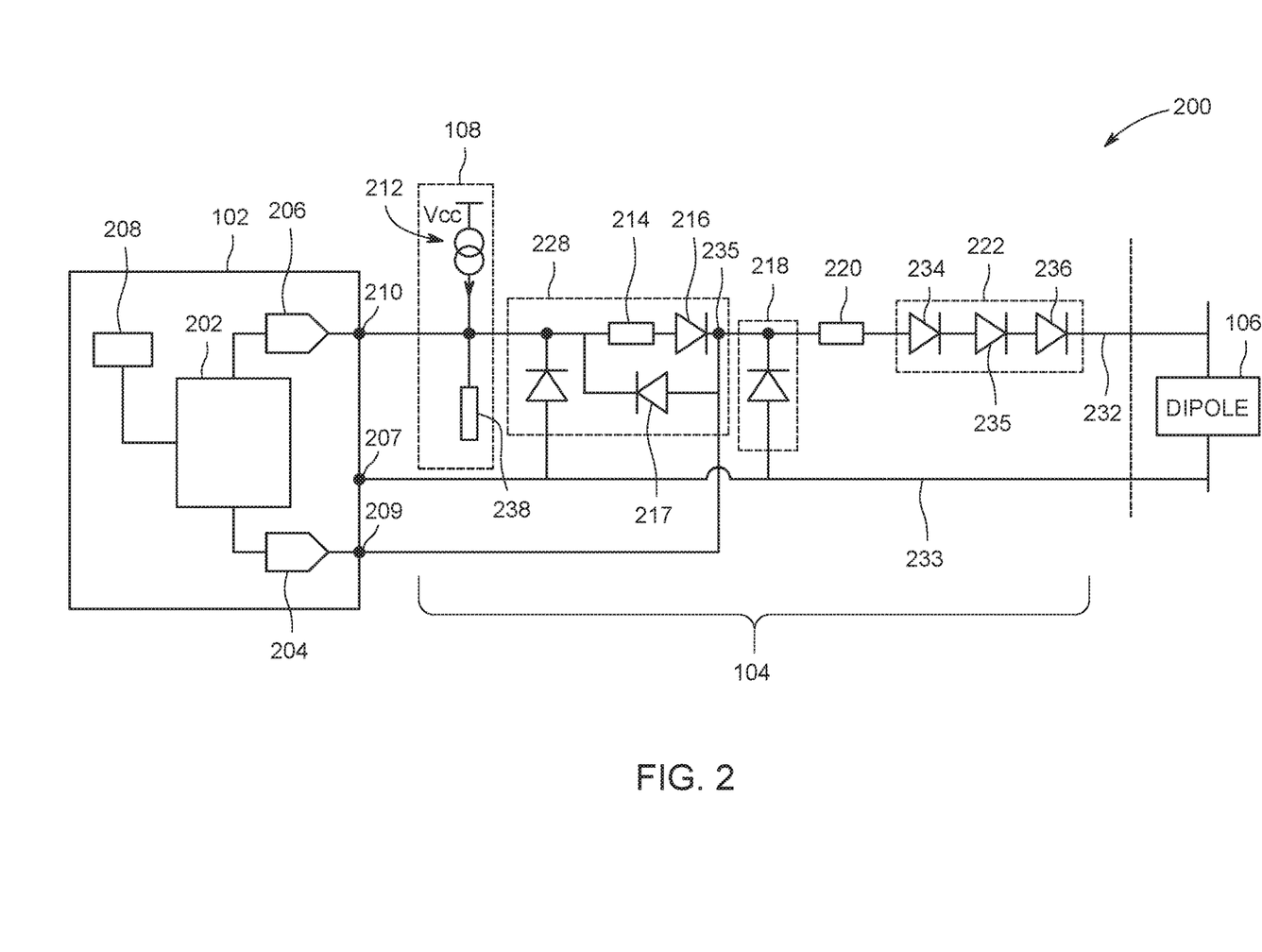
FIG. 2 illustrates a schematic illustration of an embodiment of operational circuitry of the voltage measurement system shown in FIG. 1.

In connection with FIG. 2, the operational circuitry 104 may be configured to electrically couple the measurement circuit 102 to the two-state dipole. For example, the operational circuitry 104 is utilized by the measurement circuit 102 to measure a voltage at a measurement terminal 232 when the two-state dipole 106 is in a saturation state (e.g., ON state). In another example, the operational circuitry 104 is configured to isolate and/or protect the measurement circuit 102 during a voltage of the measurement terminal 232 when the two-state dipole 106 is in an OFF state.

FIG. 2 illustrates a schematic illustration of an embodiment of the operational circuitry 104 of the voltage measurement system 100. The operational circuity 104 is electrically coupled to the two-state dipole 106 via a measurement terminal 232 and a reference terminal 233. The measurement terminal 232 and the reference terminal 233 are electrically coupled to opposing terminals of the two-state dipole 106. The operational circuitry 104 includes a compensation circuit 228. The compensation circuit 228 is electrically coupled to the measurement circuit 102 via a first sensor terminal 210, optionally, the power source 108. A first sensor terminal 210 of the measurement circuit 102 is electrically coupled to the measurement terminal 232 via a node 235 interposed between the compensation circuit 228 and an isolation circuit 222. The power source 108 may be configured to provide a supply voltage and thereby an observer current along the measurement terminal 232 utilized to measure a voltage of the two-state dipole 106. Optionally, the power source 108 may include a current source 212 and/or a resistor 238 to define the voltage supply.

The compensation circuit 228 may include the at least one diode 216 electrically coupled to an isolation circuit 222. The at least one diode 216 are configured in anti-series with respect to the sensor terminal 210. For example, a polarity of the at least one diode 216 is opposed with respect to the measurement terminal 232 to the sensor terminal 210, such that a cathode of the at least one diode 216 is directly electrically coupled to the isolation circuit 222. Optionally, the compensation circuit 228 may include at least one pair of diodes 216 and 217 configured in anti-parallel with respect to each other. For example, the diodes 216 and 217 are in anti-parallel by electrically coupling the at least one diode 216 and 217 in parallel with each other with the polarities of the diodes 216 and 217 opposed and/or reversed with respect to each other, such that an anode of the diode 217 is electrically coupled to the sensor terminal 210. The compensation circuit 228 may be configured to clamp a voltage of the sensor terminal 210 based on the supply voltage. For example, a voltage drop along one of the diodes 216, 217 based on the state of the two-state dipole 106 maintains a voltage at a second sensor terminal 209 above and/or proximate to the supply voltage provided by the power supply 108. Optionally, the compensation circuit 228 may include additionally components configured to limit, clamp, and/or compensate for a negative voltage across the at least one diode 216 when the two-state dipole 106 is in an OFF state. For example, the compensation circuit 228 may include additional diodes in series with the at least one diode 216 and/or the diode 217 to increase the clamping operation of the compensation circuit 228. In another example, the compensation circuit 228 may include a resistor 214 for compensation, such as for the resistor 220. Additionally or alternatively, the diode 217 may represent a clamping circuit of the compensation circuit 228. The diode 217 is configured to limit a voltage at the sensor terminal 209 with respect to a voltage of the reference terminal 233, such that the voltage above a non-zero predetermined compensation threshold. For example, the non-zero predetermined compensation threshold may represent a magnitude of a negative voltage of the compensation circuit 228 with respect to the reference terminal 233.

The operational circuitry 104 includes an isolation circuit 222. The isolation circuit 222 is electrically coupled to the measurement terminal 232. The isolation circuit 222 is configured to decouple the measurement terminal 232 from the compensation circuit 228 when the dipole voltage at the measurement terminal 232 is above a non-zero predetermined decoupling threshold. The non-zero predetermined decoupling threshold may represent a magnitude of a positive voltage of the compensation circuit 228 with respect to the reference terminal 233. For example, when the dipole voltage at the measurement terminal 232 is positive, the isolation circuit 222 may be configured to decouple and/or insulate the compensation circuit 228 from the measurement terminal 232. The isolation circuit 222 may include one or more diodes 234-236, such that the reverse voltage may represent a sum of the breakdown voltages of the diodes 234-236 of the isolation circuit 222. For example, the cathodes of the one or more diodes 234-236 are directly electrically coupled to the measurement terminal 232.

The isolation circuit 222 is configured to isolate the measurement circuit 102 from the voltage of the measurement terminal 232 (e.g., the dipole voltage) during the OFF state of the two-state dipole 106. For example, the isolation circuit 222 may be configured to have a reverse voltage, breakdown voltage and/or avalanche threshold greater than a dipole voltage of the measurement terminal 232 (e.g., the dipole voltage) during the OFF state of the two-state dipole 106. The predetermined threshold may be based on the power rail and/or power line utilized by the power electrical system 112. For example, the predetermined threshold may be a set margin (e.g., percentage, voltage magnitude) from a voltage of the power rail and/or power line, such as 3%, 5%, 5 volts, 10 volts, and/or the like. The reverse voltage may be configured to reduce the voltage of the measurement terminal 232 such that the voltages at the sensor terminals 209, 210 are below the supply voltage.

Additionally or alternatively, the operational circuitry 104 may include a voltage clamping circuit 218. The voltage clamping circuit 218 may include a diode and/or a Zener diode having an anode directly electrically coupled to the reference terminal 233 and a cathode directly coupled to the isolation circuit 222. The voltage clamping circuit 218 may be configured to limit a voltage and/or current of the isolation circuit when the voltage with respect to the reference terminal is below a non-zero predetermined clamping threshold to protect the measurement circuit 102 from a negative voltage of the measurement terminal 232. The non-zero predetermined clamping threshold may represent a negative voltage of the isolation circuit 222 with respect to the reference terminal 233. For example, the voltage clamping circuit 218 may be configured to short the measurement terminal 232 to ground when the voltage of the measurement terminal 232 is below the non-zero predetermined clamping threshold based on the voltage of the isolation circuit 222. Optionally, the non-zero predetermined clamping threshold may correspond to a breakdown voltage of the voltage clamping circuit 218 based on the diode and/or the Zener diode of the voltage clamping circuit 218.

Additionally or alternatively, the operational circuitry 104 may include a resistor 220 electrically coupled in series to the one or more diodes 234-236 of the isolation circuit 222. For example, the resistor 220 may be interposed between the isolation circuit 222 and the voltage clamping circuit 218. The resistor 220 is configured to limit the current to the voltage clamping circuit 218 when the voltage clamping circuit 218 is active (e.g., voltage of the measurement terminal 232 is below a voltage threshold). In various embodiments, the resistor 220 and voltage clamping circuit 218 may be activated for a short period of time, such as a few hundreds of nanoseconds based on thermal limitations. It may be noted that the resistor 214 of the compensation circuit 228 may be configured to compensate for the resistor 220. For example, the resistor 214 may be configured to compensate for the voltage drop across the resistor 220. Optionally, a relationship between electrical characteristics (e.g., resistance) of the resistors 214 and 220 may be based on a number of the one or more diodes 234-236 of the isolation circuit 222 and the at least one diode 216 of the compensation circuit 228. For example, a resistance value of the resistor 214 may be a ratio relative to a resistance value of the resistor 220. The ratio may be based on the isolation circuit 222 relative to the compensation circuit 228, such as the number (e.g., n) of the one or more of diodes 234-236 of the isolation circuit 222 to define a ratio of n:1 relative to a number of the at least one diode 216 of the compensation circuit 228. For example, the isolation circuit 222 may include a set of three diodes 234-236 and the compensation circuit 228 may include the one diode 216. Based on the number of diodes, the ratio may be defined as 3:1 corresponding to the resistance value of the resistor 220 is three times the resistance value of the resistor 214. Additionally or alternatively, temperature coefficients of the resistors 214 and 220 may be within a non-zero predetermined coefficient threshold. The non-zero predetermined coefficient threshold may be a percentage value, such as 1% and/or below 6%. Optionally, the non-zero predetermined coefficient threshold may be a magnitude threshold relative to each other.

The measurement circuit 102 has a first terminal 207 electrically coupled to the reference terminal 233, a second terminal that is the first sensor terminal 210 electrically coupled to the compensation circuit 228 and a third terminal that is the second sensor terminal 209 electrically coupled to the node 235. The measurement circuit 102 is configured to compensate the sensing voltages measured at the sensor terminals 209, 210 to determine and/or estimate the dipole voltage and/or voltage across the measurement terminal 232 in reference to a voltage at the reference terminal 233 based on a number of the one or more diodes 234-236 of the isolation circuit 222 and the at least one diode 216 of the compensation circuit 228. For example, the measurement circuit 102 may compensate the sensing voltages at the sensor terminals 209, 210 based on Equation 1 shown below. The Vmeas_sens may represent the sensing voltage measured by the measurement circuit 102 at the sensor terminal 210 with respect to the fit terminal 207. The Vmeas_sens_compensation may represent the sensing voltage measured by the measurement circuit 102 at the sensor terminal 209 with respect to the first terminal 207. The Vmeas may represent the voltage across the measurement terminal 232 and the reference terminal 233 corresponding to the dipole voltage. The variable n may be based on a number of the one or more diodes 234-236 of the isolation circuit 222 and the at least one diode 218 of the compensation circuit 228. The variable n is defined by the measurement circuit 102. For example, n may correspond to a ratio of the number of diodes 234-236 of the isolation circuit 222, such as three as shown in FIG. 2, relative to the at least one diode 216 of the compensation circuit 228. Thereby, it may be noted that in at least one embodiment the dipole voltage of the measurement terminal 232 and the reference terminal 233 may be based on a number of the one or more of diodes 234-236 of the isolation circuit 222.

$$\text{Vmeas}=\text{Vmeas\_sens}-(n+1)\cdot(\text{Vmeas\_sens}-\text{Vmeas\_sens\_compensation}) \quad \text{Equation 1}$$

The Vmeas_sens and the Vmeas_sens_compensation may correspond to a digital measurement of the voltage of the corresponding sensor terminals 209, 210 relative to a voltage at the first terminal 207. For example, the measurement circuit 102 may include analog digital converters (ADC) 204, 206 electrically coupled to the sensor terminals 209 and 210 and the reference terminal 207. The ADCs 204, 206 are configured to convert a voltage differences between the sensor terminals 209 and 210 and the first terminal 207 into digital values representing the sensing voltages and the reference voltage. For example, the ADC 204 is configured to convert the voltage difference between the sensor terminal 209 and the first terminal 207 into a digital value. In another example, the ADC 206 is configured to convert the voltage difference between the sensor terminal 210 and the first terminal 207 into a digital value. Optionally, the digital values representing the voltages at the sensor terminals 209 and 210 and the first terminal 207 may be stored in the memory 208. The measurement circuit 102 may include a controller circuit 202 configured to execute one or more software instruction stored in the memory 208. For example, the controller circuit 202 include one or more processors configured to execute instructions stored in the memory 208, such as to process the Vmeas_sens and the Vmeas_sens_compensation as shown in Equation 1.

The measurement circuit 102 may be configured to compensate the sensing voltages measured at the sensor terminals 209, 210 for temperature coefficients of one or more components (e.g., the diodes 216-217, 234-236, resistors 214, 220, 238) of the operational circuitry 104, current supplied by the power supply 108, and/or the like to determine the dipole voltage and/or the voltage across the measurement terminal 232 (e.g., represented as Vmeas).

In at least one embodiment, a number of the one or more of diodes 234-236 of the isolation circuit 222 with the at least one diode 216 may be based on a power of two. The power of two may correspond to an even number of the variable, (n+1) of Equation 1, representing the electrical components (e.g., such as the diodes) of the isolation circuit 222 and the compensation circuit 228 along a direction of current of the operational circuitry 104. For example, during the ON state of the two-state dipole 106 the observation current flows through the at least one diode 216 of the compensation circuit 228 and the one or more of diodes 234-236 of the isolation circuit 222 corresponding to four components. The ratio (e.g., represented as the variable n) representing a number of the one or more diodes 234-236 of the isolation circuit 222 over a number of the at least one diode 216 of the compensation circuit 228. For example, the ration (e.g., n) corresponds to a value of 3/1. Thus, the variable (n+1) of Equation 1 is an even number (e.g., (3/1+1)=4) and thereby is based on the power of two. It may be noted, that based on the configuration of the compensation circuit 228 (e.g., the anti-parallel position of the diodes 216, 217) the isolation circuit 222 having an odd number of components (e.g., diodes) may conform to the power of two. As described herein, the power of two reduces processing strain on the measurement circuit 102 by allowing binary shifting to determine the voltage of the measurement terminal 232.

Figure 3:
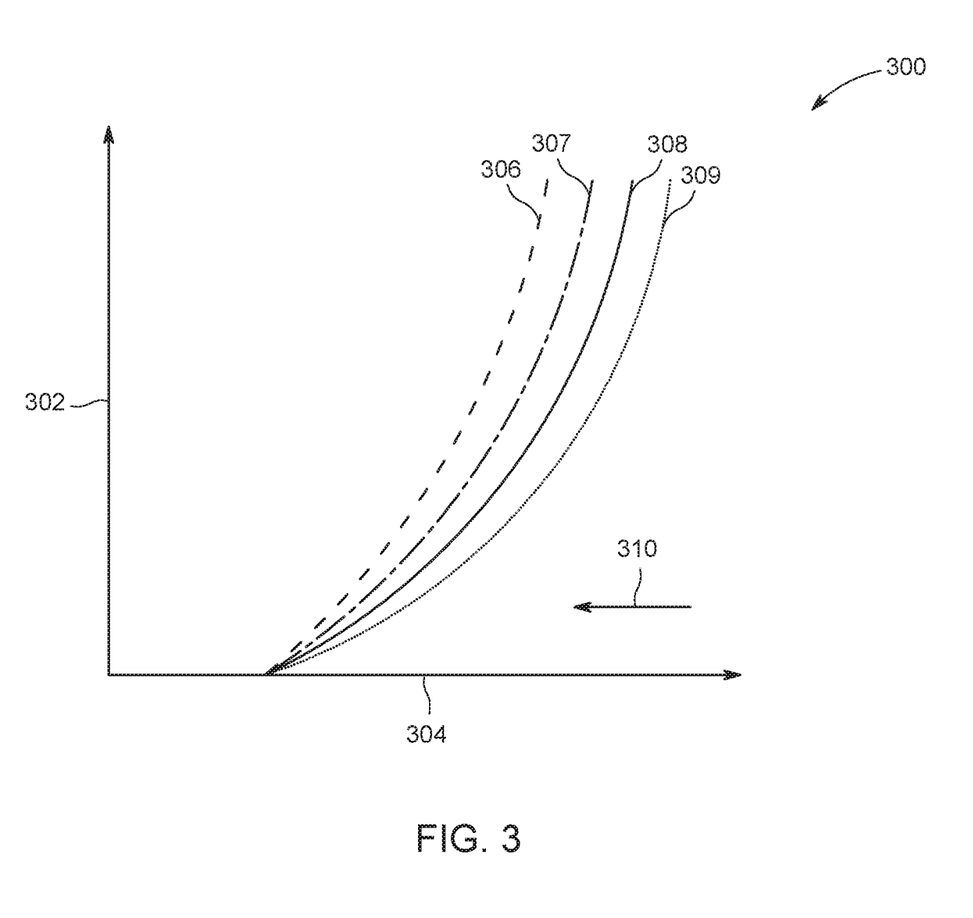
FIG. 3 illustrates electrical characteristics of an embodiment of a diode of the operational circuitry shown in FIG. 2.

FIG. 3 illustrates electrical characteristics 306-309 of an embodiment of the diodes 216-217, 234-236 of the operational circuitry 104 shown in FIG. 2. It may be noted that the temperature coefficient of the diodes 216-, 243-236 may each have substantially similar temperature coefficients. The electrical characteristics 306-309 of the diodes 216-, 234-236 are shown as a graphical representation 300 along a horizontal axis 304 representing a voltage and a vertical axis 302 representing current. The electrical characteristics 306-309 represent different ambient temperatures of the diodes 216-, 234-236. As the ambient temperature of the diodes 216-, 234-236 increases, the electrical characteristics 306-309 shifts affected a voltage drop and/or current of the diodes 216-, 234-236 in a direction of an arrow 310. For example, the ambient temperature of the diodes 216-, 234-236 represented as the electrical characteristics 306 is higher relative to the ambient temperature of the diodes 216-, 234-236 represented as the electrical characteristics 308. Thereby, the temperature of the operational circuitry 104 affects the voltage drop at the one or more components of the operational circuitry 104 based on the temperature coefficient of the corresponding component. For example, the diodes 216, 217 may have a temperature coefficient of −2 mV/° C., such that a change in temperature of 1° C. changes the voltage drop of the diodes 216, by 2 millivolts. The power electrical system 112 may operate in temperature ranging from −40° C. to 100° C. Due to the proximity of the operational circuitry 104 to the two-state dipole 106 conductively coupled to the-power electrical system 112, the electrical characteristics of the components of the operational circuitry 104 may be affected by the temperature generated by the power electrical system 112.

Returning to FIG. 2, the sensing voltage at the sensor terminal 210 is based on the voltage drop of the at least one diode 216 and the one or more diodes 234-236, and thereby is affected by the temperature of the operational circuitry 104. Optionally, a position and/or location of the isolation circuit 222 and the compensation circuit 228 are configured such that the isolation circuit 222 and the compensation circuit 228 are subjected to a common ambient temperature. For example, the isolation circuit 222 and the compensation circuit 228 may be contained within a single housing. The compensation circuit 228 may be exposed to a first ambient temperature, and the isolation circuit 222 may be exposed to a second ambient temperature. Based on a location, close proximity, of the compensation circuit 228 with the isolation circuit 222 the first and second ambient temperatures are substantially similar to each other. For example, the first and second ambient temperature may be within a degree of each other.

The measurement circuit 102 is configured to measure the voltages at the sensor terminals 209, 210 and compensate the voltage values as described in Equation 1. For example, the ADCs 204, 206 may convert the voltages at the sensor terminals 209, 210 to a digital value relative to the first terminal 207. The controller circuit 202 may compare the voltage values to determine a voltage difference between the sensor terminal 209 (e.g., Vmeas_sens) and the sensor terminal 210 (e.g., Vmeas_sens_compensation). The voltage difference may represent the voltage drop of the at least one diode 216 and resistor 228, which are effected by the temperature in the same way as one or more of diodes 234-236 of the isolation circuit 222 and the resistor 220. The measurement circuit 102 may compensate the voltage of the sensor terminal 209 based on the voltage difference to compensate the voltage of the sensor terminal 210 for the voltage drop across all components along the measurement path between the measurement terminal 232 and the sensor terminal 210. For example, the components along the measurement path include the resistor 214, the at least one diode 216, the resistor 220 and the isolation circuit 222 and thereby compensate for temperature dependence of the components.

In at least one embodiment, the measurement circuit 102 may adjust the compensation based on additional components (e.g., the diodes 216-217, 234-236, the resistors 214, 220, 238) of the operational circuitry 104. For example, the diodes 234-236 of the isolation circuit 222 may have the same temperature coefficient as the at least one diode 216, 217 of the compensation circuit 228, and the resistors 214, 220 and 238 have the same temperature coefficient. The thermal and/or electrical characteristics of the one or more diodes 234-236 of the isolation circuit 222 and the at least one diode 216 of the compensation circuit 228 may be within a non-zero predetermined threshold with respect to each other, such that they are the same. The non-zero predetermined threshold may be a percentage value, such as 1% and/or below 6%. Optionally, the non-zero predetermined threshold may be a magnitude threshold relative to each other. The measurement circuit 102 may be configured to adjust the voltage of the sensor terminal 210 (e.g., Vmeas_sens) based on a number of components of the operational circuitry 104. For example, the operational circuitry 104 may include the diodes 234-236 of the isolation circuit 222 as shown in FIG. 2. The number of diodes 234-236 may be stored in the memory 208. The measurement circuit 102 is configured to define n, shown in Equation 1, which is based on the number diodes 234-236 of the isolation circuit 222. For example, the measurement circuit 102 may define n as the number 3 representing the diodes 234-236, which is utilized to define an amount to adjust the voltage of the sensor terminal 210 (e.g., Vmeas_sens). The measurement circuit 102 may multiply the difference in voltage (e.g., Vmeas_sens−Vmeas_sens_compensation) by n+1 (e.g., 3+1, 4), to account for the additional diodes 234-236 relative to the at least one diode 216. To compensate for the effects of the temperature on the diodes 216, and 234-236 to determine the dipole voltage (e.g., Vmeas), the measurement circuit 102 may be configured to subtract from the voltage of the sensor terminal 210 (e.g., Vmeas_sens) by the adjusted difference in voltage as described in Equation 1.

Figure 4:
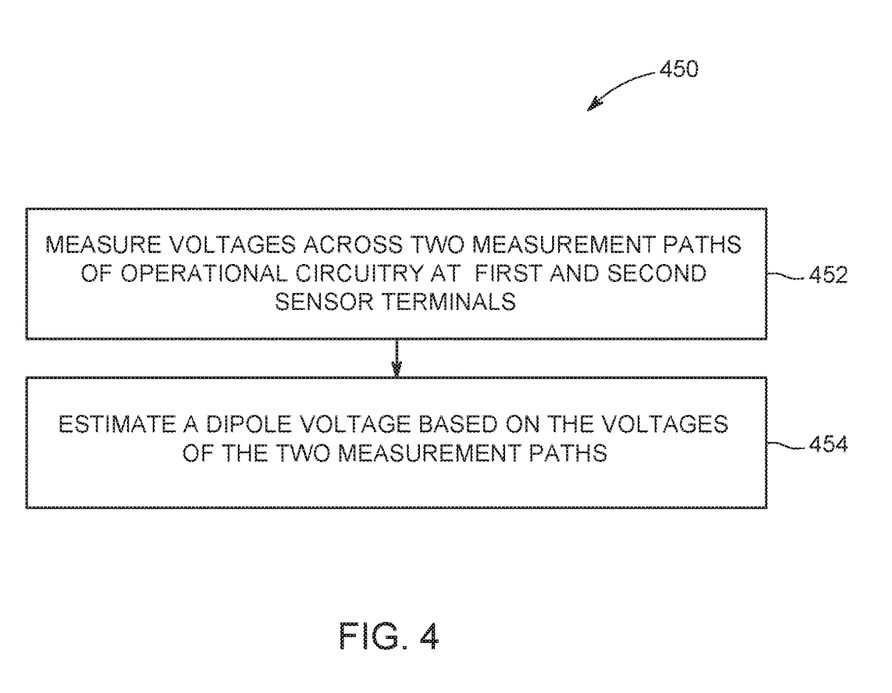
FIG. 4 illustrates a flow chart of an embodiment of a method for measuring a voltage of a two-state dipole.

FIG. 4 is a flow chart of an embodiment of a method 450 for voltage sensing a two-state dipole 106. The method 450, for example, may employ or be performed by structures or aspects of various embodiments (e.g., the measurement circuit 102, the operational circuitry 104, and/or the like) discussed herein. In various embodiments, certain operations may be omitted or added, certain operations may be combined, certain operations may be performed simultaneously, certain operations may be performed concurrently, certain operations may be split into multiple operations, certain operations may be performed in a different order, or certain operations or series of operations may be re-performed in an iterative fashion. In various embodiments, portions, aspects, and/or variations of the method 450 may be able to be used as one or more algorithms to direct hardware to perform one or more operations described herein.

Beginning at 452, the measurement circuit measures voltages across two measurement paths of the operational circuitry 104 at a first and second sensor terminals 209 and 210. For example, in connection with FIG. 2, the power supply 108 may deliver an observing current to the measurement terminal 232. The power supply 108 may be electrically coupled to the compensation circuit 228 and the measurement terminal 232. The measurement terminal 232 is electrically coupled to the two-state dipole 106. The power supply 108 is configured to provide a voltage and thereby a current to the components of the operational circuitry 104 (e.g., the diodes 216, 217) corresponding to the observing current. The observing current is delivered to the measurement terminal 232 via the compensation circuit 228, which is electrically coupled to the power supply 108 and the measurement terminal 232.

The dipole voltage of the measurement terminal 232 relative to the reference terminal 233 is adjusted by the two-state dipole 106 during the ON state. For example, the dipole voltage of the measurement terminal 232 is pulled to match the voltage drop across the two-state dipole 106 when in the ON state. The first sensing voltage at the sensor terminal 210 is effected by the first measurement path between the sensor terminal 210 and the measurement terminal 232. For example, the first sensing voltage includes voltage drops across the compensation circuit 228 (e.g., the resistor 214, the at least one diode 216), the resistor 220, and the isolation circuit 222. The second sensing voltage at the sensor terminal 209 is effected by the second measurement path, which is different relative to the sensor terminal 210. For example, the second sensing voltage includes voltage drops across the resistor 220 and the isolation circuit 222, but does not include the compensation circuit 228. The ADCs 204, 206 may convert the sensing voltages at the sensor terminals 209, 210 to a digital value relative to the voltage at the first terminal 207, which may be stored in the memory 208.

Figure 5:
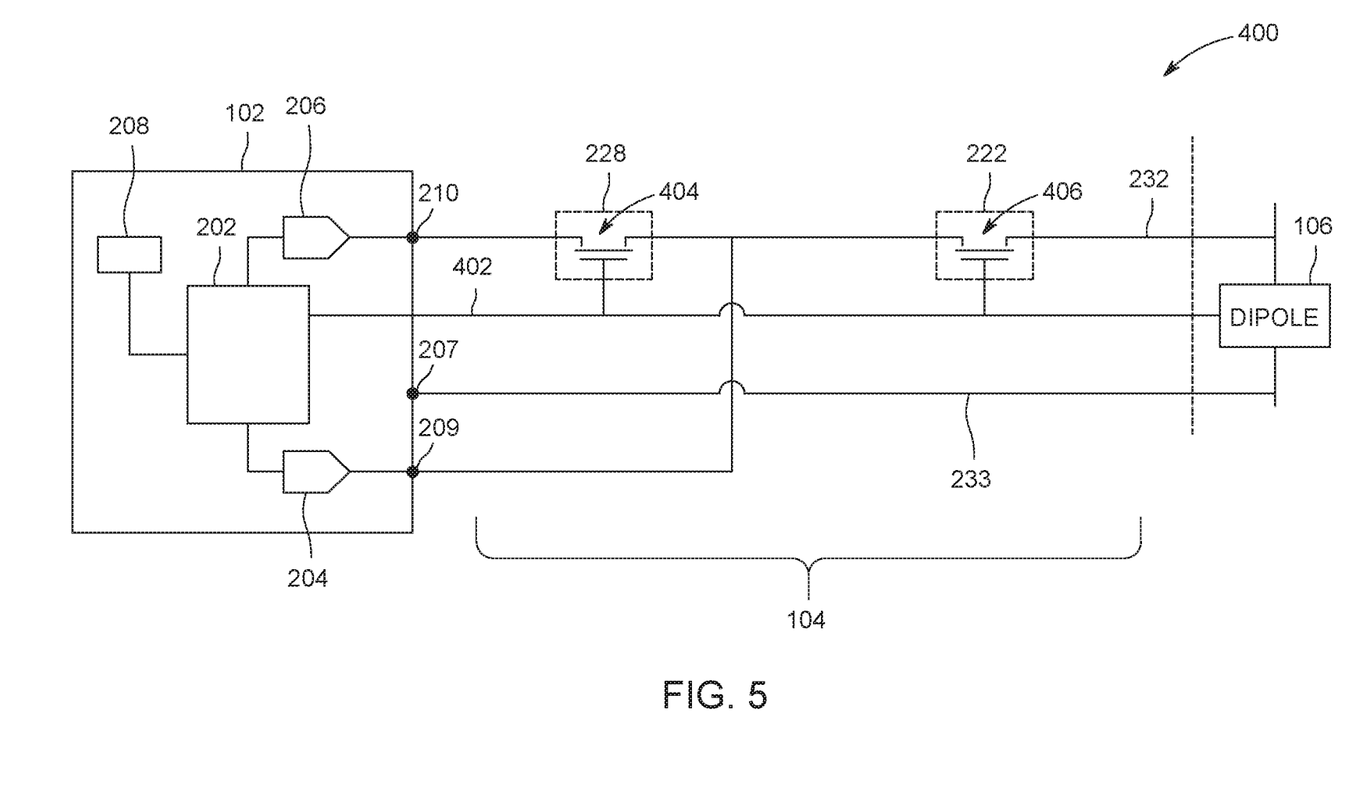
FIG. 5 illustrates a schematic illustration of an embodiment of operational circuitry of the voltage measurement system shown in FIG. 1.

Additionally or alternatively, in connection with FIG. 5 a power supply 108 is not needed to measure the voltages across two measurement paths at the sensor terminals 209, 210.

FIG. 5 illustrates a schematic illustration 400 of an embodiment of operational circuitry 104 of the voltage measurement system 100 shown in FIG. 1. The schematic illustration 400 includes one or more semiconductor switches 404, 406. The one or more semiconductor switches 404, 406 are illustrated as metal oxide semiconductor field effect transistor (MOSFETS). However, the one or more semiconductor switches 404, 406 may be insulated gate bipolar transistors (IGBT), bipolar junction transistors (BJT), metal oxide semiconductor controller thyristors (MCT), and/or the like. It may be noted that the semiconductor switch fabrication may include silicon, silicon-carbide, and/or the like. For example, the isolation circuit 222 includes a first semiconductor switch 406, and the compensation circuit 228 includes a second semiconductor switch 404. The first and second semiconductor switches 404, 406 may be controlled by the measurement circuit 102. For example, the measurement circuit 102 includes a control bus 402 electrically coupled to the first and second semiconductor switches 404, 506. The measurement circuit 102 is configured to activate the first semiconductor switch 406 and/or the second semiconductor switch 404 based on electrical characteristics of the control bus 402. For example, the measurement circuit 102 may adjust gate voltages at the first semiconductor switch 406 and/or the second semiconductor switch 404 to activate and/or deactivate the first semiconductor switch 406 and/or the second semiconductor switch 404.

During an ON state of the two-state dipole 106, the measurement circuit 102 may configured to the electrical characteristics of the control bus 402 to activate the first and second semiconductor switches 404, 408. For example, when the first and second semiconductor switches 404, 408 are activated, the first sensing voltage at the sensor terminal 210 is effected by the first measurement path between the sensor terminal 210 and the measurement terminal 232. The second sensing voltage at the sensor terminal 209 is effected by the second measurement path, which is different relative to the sensor terminal 210. For example, the first measurement path includes the compensation circuit 228 and the isolation circuit 222, conversely the second measurement includes the isolation circuit 222. The ADCs 204, 206 may convert the sensing voltages at the sensor terminals 209, 210 to a digital value, which may be stored in the memory 208.

Returning to FIG. 4, at 454, the measurement circuit 102 is configured to determine and/or estimate the dipole voltage based on the voltages of the two measurement paths. For example, the measurement circuit 102 may determine the dipole voltage by compensating the voltage measures along the first measurement path based on a voltage difference between the first and second measurement path. The voltage difference between the measurement paths is based on a voltage drop across the compensation circuit 228.

For example, in connection with FIG. 2, the voltage measured along the first measurement path (e.g., a first sensing voltage) is based on the voltage drop of the at least one diode 216 and the resistor 228, alternatively, the voltage measured along the second measurement path (e.g., a second sensing voltage) is not based on a voltage drop from the compensation circuit 228 forming the voltage difference. The measurement circuit 102 may compensate the first sensing voltage as described in Equation 1 to account for the voltage drops of the isolation circuit 222 and the compensation circuit 228. It may be noted by compensating for the voltage drop the effects of temperature on the compensation circuit 228 and the isolation circuit 222 is minimized. For example, the measurement circuit 102 may use the voltage values to determine the voltage difference between the sensor terminal 210 (e.g., Vmeas_sens shown in Equation 1) and the sensor terminal 209 (e.g., Vmeas_sens_compensation shown in Equation 1). The voltage difference is multiplied by the measurement circuit 102 based on a number of components along the measurement path between the sensor terminal 210 and the measurement terminal 232 represented by the compensation circuit 228 and isolation circuit 222. For example, as shown in FIG. 2, the voltage difference may be multiplied by four representing the at least one diode 216 of the compensation circuit 228 and the one or more diodes 234-236 of the isolation circuit 222. The increased voltage difference (e.g., the voltage difference multiplied by the variable (n+1) shown in Equation 1 based on a number components along the measurement path) calculated by the measurement circuit 102 is utilized to compensate the first sensing voltage of the sensor terminal 210 as described in Equation 1 to determine the dipole voltage.

It may be noted that the isolation circuit 222 may decouple the measurement terminal 232 from the compensation circuit 228 based on the dipole voltage at the measurement terminal 232, such as during the OFF state of the two-state dipole 106. For example, in connection with FIG. 2, the voltage of the measurement terminal 232 with respect to the reference terminal 233 is adjusted by the power electric system (e.g., during the OFF state of the two-state dipole 106) to a voltage above a specification threshold of the measurement circuit 102. The specification threshold may represent a voltage limit at the sensor terminals 209-210. For example, a voltage above the specification threshold may damage and/or disable the measurement circuit 102. The isolation circuit 222 is configured to decouple the measurement circuit 102 based on the configuration and/or polarity of the diodes 234-236. For example, the cathodes of the diodes 234-236 are directly coupled to the measurement terminal 232 such that the voltage and/or current of the measurement terminal 232 is decoupled from the compensation circuit 228 and/or the node 235. Additionally or alternatively, the operational circuitry 104 may include the voltage clamping circuit 218 configured to further isolate and/or decouple the measurement circuit 102 during voltage peaks (e.g., negative voltage peaks) along the measurement terminal 232 with respect to the reference terminal 233. Additionally or alternatively, the anti-parallel configuration of the diodes 216, 217 of the compensation circuit 228 enables the diode 217 to clamp the voltage of the sensor terminal 209 to restrict the voltage during the OFF state of the two-state dipole 106.

In connection with FIG. 5, the measurement circuit 102 may decouple the measurement terminal 232 from the compensation circuit 228 by deactivating the first semiconductor switch 406. For example, during the OFF state of the two-state dipole 106 the measurement circuit 102 adjusts the electrical characteristics of the control bus 402 to deactivate the first semiconductor switch 406 to decouple the measurement terminal 232 from the compensation circuit 228.

It should be noted that the particular arrangement of components (e.g., the number, types, placement, and/or the like) of the illustrated embodiments may be modified in various alternate embodiments. For example, in various embodiments, different numbers of a given module or unit may be employed, a different type or types of a given module or unit may be employed, a number of modules or units (or aspects thereof) may be combined, a given module or unit may be divided into plural modules (or sub-modules) or units (or sub-units), one or more aspects of one or more modules may be shared between modules, a given module or unit may be added, or a given module or unit may be omitted.

As used herein, a structure, limitation, or element that is "configured to" perform a task or operation is particularly structurally formed, constructed, or adapted in a manner corresponding to the task or operation. For purposes of clarity and the avoidance of doubt, an object that is merely capable of being modified to perform the task or operation is not "configured to" perform the task or operation as used herein. Instead, the use of "configured to" as used herein denotes structural adaptations or characteristics, and denotes structural requirements of any structure, limitation, or element that is described as being "configured to" perform the task or operation. For example, a processing unit, processor, or computer that is "configured to" perform a task or operation may be understood as being particularly structured to perform the task or operation (e.g., having one or more programs or instructions stored thereon or used in conjunction therewith tailored or intended to perform the task or operation, and/or having an arrangement of processing circuitry tailored or intended to perform the task or operation). For the purposes of clarity and the avoidance of doubt, a general purpose computer (which may become "configured to" perform the task or operation if appropriately programmed) is not "configured to" perform a task or operation unless or until specifically programmed or structurally modified to perform the task or operation.

It should be noted that the various embodiments may be implemented in hardware, software or a combination thereof. The various embodiments and/or components, for example, the modules, or components and controllers therein, also may be implemented as part of one or more computers or processors. The computer or processor may include a computing device, an input device, a display unit and an interface, for example, for accessing the Internet. The computer or processor may include a microprocessor. The microprocessor may be connected to a communication bus. The computer or processor may also include a memory. The memory may include Random Access Memory (RAM) and Read Only Memory (ROM). The computer or processor further may include a storage device, which may be a hard disk drive or a removable storage drive such as a solid state drive, optic drive, and the like. The storage device may also be other similar means for loading computer programs or other instructions into the computer or processor.

As used herein, the term "computer," "controller," and "module" may each include any processor-based or microprocessor-based system including systems using microcontrollers, reduced instruction set computers (RISC), application specific integrated circuits (ASICs), logic circuits, GPUs, FPGAs, and any other circuit or processor capable of executing the functions described herein. The above examples are exemplary only, and are thus not intended to limit in any way the definition and/or meaning of the term "module" or "computer."

The computer, module, or processor executes a set of instructions that are stored in one or more storage elements, in order to process input data. The storage elements may also store data or other information as desired or needed. The storage element may be in the form of an information source or a physical memory element within a processing machine.

The set of instructions may include various commands that instruct the computer, module, or processor as a processing machine to perform specific operations such as the methods and processes of the various embodiments described and/or illustrated herein. The set of instructions may be in the form of a software program. The software may be in various forms such as system software or application software and which may be embodied as a tangible and non-transitory computer readable medium. Further, the software may be in the form of a collection of separate programs or modules, a program module within a larger program or a portion of a program module. The software also may include modular programming in the form of object-oriented programming. The processing of input data by the processing machine may be in response to operator commands, or in response to results of previous processing, or in response to a request made by another processing machine.

As used herein, the terms "software" and "firmware" are interchangeable, and include any computer program stored in memory for execution by a computer, including RAM memory, ROM memory, EPROM memory, EEPROM memory, and non-volatile RAM (NVRAM) memory. The above memory types are exemplary only, and are thus not limiting as to the types of memory usable for storage of a computer program. The individual components of the various embodiments may be virtualized and hosted by a cloud type computational environment, for example to allow for dynamic allocation of computational power, without requiring the user concerning the location, configuration, and/or specific hardware of the computer system.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f) unless and until such claim limitations expressly use the phrase "means for" followed by a statement of function void of further structure.

This written description uses examples to disclose the various embodiments, and also to enable a person having ordinary skill in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal language of the claims.

What is claimed is:

1. A voltage measurement system for a two-state dipole comprising:
   a reference terminal electrically coupled to a first dipole terminal of the two-state dipole and a measurement terminal electrically coupled to a second dipole terminal of the two-state dipole;
   an isolation circuit electrically coupled to the measurement terminal;
   a compensation circuit electrically coupled to the isolation circuit, wherein the isolation circuit is configured to decouple the measurement terminal from the compensation circuit based on a voltage at the measurement terminal; and
   a measurement circuit having three terminals, a first terminal is electrically coupled to the reference terminal, a second terminal is electrically coupled to the compensation circuit, a third terminal is electrically coupled to a node interposed between the compensation circuit and the isolation circuit, the measurement circuit configured to measure a first voltage at the second terminal and a second voltage at the third terminal, wherein the measurement circuit is configured to estimate a voltage of the two-state dipole based on the first and second voltages.

2. The voltage measurement system of claim 1, wherein the isolation circuit comprises one or more diodes, wherein a cathode of the one or more diodes is electrically coupled to the measurement terminal, and the compensation circuit comprises at least one diode, wherein a cathode of the at least one diode is electrically coupled to the isolation circuit; and
   a power supply electrically coupled to the compensation circuit.

3. The voltage measurement system of claim 2, wherein the measurement circuit is configured to estimate the voltage of the two-state dipole based on a number of the one or more diodes of the isolation circuit and the at least one diode of the compensation circuit.

4. The voltage measurement system of claim 3, wherein the measurement circuit is configured to define a ratio based on the number of the one or more diodes of the isolation circuit and the at least one diode of the compensation circuit, the estimation of the voltage of the two-state dipole is determined by subtracting from the first voltage a difference between the first and second voltages multiplied by the ratio plus one.

5. The voltage measurement system of claim 2, wherein the isolation circuit is electrically coupled to a resistor in series with the one or more diodes, the compensation circuit includes a resistor, wherein a relationship between a resistance of the resistor of the compensation circuit and a resistance of the resistor electrically coupled to the isolation circuit is based on a number of the one or more diodes of the isolation circuit and the at least one diode of the compensation circuit.

6. The voltage measurement system of claim 5, wherein temperature coefficient of the resistor electrically coupled to the isolation circuit and temperature coefficient of the resistor of the compensation circuit are the same within a non-zero predetermined coefficient threshold.

7. The voltage measurement system of claim 2, wherein thermal and electrical characteristics of the one or more diodes of the isolation circuit and the at least one diode of the compensation circuit are within a non-zero predetermined threshold with respect to each other.

8. The voltage measurement system of claim 2, wherein the power supply includes a current source.

9. The voltage measurement system of claim 1, wherein the compensation circuit includes a voltage clamping circuit that is configured to limit the second voltage at the third terminal of the measurement circuit.

10. The voltage measurement system of claim 9, wherein the voltage clamping circuit comprises a diode in parallel with the compensation circuit and having an anode coupled to the third terminal.

11. The voltage measurement system of claim 1, further comprising a voltage clamping circuit configured to limit a voltage at the node interposed between the compensation circuit and the isolation circuit and a current of the isolation circuit based on a second voltage at the third terminal with respect to the reference terminal.

12. The voltage measurement system of claim 11, wherein the voltage clamping circuit comprises a diode having an anode electrically coupled to the reference terminal and a cathode electrically coupled to the isolation circuit.

13. The voltage measurement system of claim 1, wherein a location of the isolation circuit and the compensation circuit are configured such that a first ambient temperature of the isolation circuit and a second ambient temperature of the compensation circuit are substantially similar.

14. The voltage measurement system of claim 1, wherein the two-state dipole includes an isolated gate bipolar transistor (IGBT), a power metal oxide semiconductor field-effect transistor, a diode, a thyristor, or a field coil of a field excited synchronous machine.

15. The voltage measurement system of claim 1, wherein the isolation circuit includes a first semiconductor switch and the compensation circuit includes a second semiconductor switch.

16. The voltage measurement system of claim 15, wherein the measurement circuit includes a control bus electrically coupled to the first and second semiconductor switches, the measurement circuit is configured to activate the first semiconductor switch or the second semiconductor switch based on electrical characteristics of the control bus.

17. A method for measuring a voltage of a two-state dipole, comprising:
measuring voltages across two measurement paths of an operational circuitry electrically coupled to the two-state dipole using a measurement circuit at a first sensor terminal and a second sensor terminal of the measurement circuit, wherein the operational circuitry comprises a compensation circuit and an isolation circuit electrically coupled to the compensation circuit, and is configured to decouple the first sensor terminal and the second sensor terminal from the compensation circuit based on a voltage of the two-state dipole; and
estimating a voltage of the two-state dipole based on the voltages across two measurement paths of the operational circuitry electrically coupled to the two-state dipole using the measurement circuit, wherein the measurement circuit is configured to estimate the voltage of the two-state dipole based on the isolation circuit and the compensation circuit.

18. The method of claim 17, further comprising injecting a measuring current to the two-state dipole via the operational circuitry, and wherein thermal and electrical characteristics of the operational circuitry is configured to be within a non-zero predetermined threshold.

19. The method of claim 18, wherein the estimating step is based on a number of one or more diodes of the isolation circuit and at least one diode of the compensation circuit.

20. A voltage measurement system for a two-state dipole, comprising:
reference and measurement terminals electrically coupled to opposing terminals of a dipole;
an isolation circuit electrically coupled to the measurement terminal, the isolation circuit having one or more diodes, wherein cathodes of the one or more diodes are electrically coupled to the measurement terminal;
a compensation circuit electrically coupled to the isolation circuit, the compensation circuit having at least one diode, wherein a cathode of the at least one diode is electrically coupled to the isolation circuit, the isolation circuit being configured to decouple the measurement terminal from the compensation circuit based on a voltage at the measurement terminal;
a power supply electrically coupled to the compensation circuit; and
a measurement circuit having three terminals, a first terminal is electrically coupled to the reference terminal, a second terminal is electrically coupled to the power supply, a third terminal is electrically coupled to a node interposed between the compensation circuit and the isolation circuit, the measurement circuit configured to measure a first voltage at the second terminal and a second voltage at the third terminal, wherein the measurement circuit is configured to estimate a voltage of the two-state dipole based on the first voltage and the second voltage and a number of the one or more diodes of the isolation circuit and the at least one diode of the compensation circuit.

* * * * *